US007007261B1

(12) United States Patent
Ballagh et al.

(10) Patent No.: US 7,007,261 B1
(45) Date of Patent: Feb. 28, 2006

(54) TRANSLATION OF AN ELECTRONIC INTEGRATED CIRCUIT DESIGN INTO HARDWARE DESCRIPTION LANGUAGE USING CIRCUIT DESCRIPTION TEMPLATE

(75) Inventors: Jonathan B. Ballagh, Longmont, CO (US); Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 347 days.

(21) Appl. No.: 10/388,711

(22) Filed: Mar. 14, 2003

(51) Int. Cl.
  *G06F 17/50* (2006.01)
(52) U.S. Cl. .................... 716/17; 716/1; 716/2; 716/18
(58) Field of Classification Search .................... 716/1, 716/2, 17, 18
  See application file for complete search history.

(56) References Cited

U.S. PATENT DOCUMENTS 6,684,381 B1 * 1/2004 Bening et al. ................ 716/18

OTHER PUBLICATIONS http://www.ee.umd.edu/%7Espivey/html/ep3/Text-EP3-Verilog-1.00.readme; "Text: :EP3::Verilog—Verilog extension for the EP3 Preprocessor"; downloaded on Mar. 3, 2003; pp. 1-2.
http://www.ee.umd.edu/%7Espivey/html/ep3/Text-EP3-1.00.readme; EP3—The Extensible Perl PreProcessor; downloaded on Mar. 3, 2003; pp. 1-7.

* cited by examiner

*Primary Examiner*—Thuan Do
(74) *Attorney, Agent, or Firm*—W. Eric Webostad; Robert Brush

(57) ABSTRACT

Method, apparatus, and computer readable medium for translating an electronic design of an integrated circuit into circuit description language is described. The electronic design includes a plurality of circuit descriptions representing behavior of circuit elements. A circuit description template is associated with a circuit description of the plurality of circuit descriptions. The circuit description template includes a first portion for fixed attributes of the circuit description and a second portion for variable attributes of the circuit description. One or more text processors are associated with the circuit description template. Variable attributes of the circuit description are related to the second portion of the circuit description template to produce a data structure. The circuit description template is processed using the one or more text processors with the data structure as parametric input.

20 Claims, 5 Drawing Sheets

```
entity <entity_name> is
  generic(
    a_width: integer :=4;
    a_bin_pt: integer :=2;
      ⋮
    c_output_width: integer := 16
  );

port(
    a: in std_logic_vector (a_width - 1 downto 0);
    a_valid: in std_logic;
      ⋮
    p_valid: out std_logic
  );
end <entity_name>;

architecture behavior of <entity_name> is
    ⋮
  component <component_name>
    port(
      clk: IN std_logic; --Port needed only when registered
      a: IN std_logic_vector (<c_a_width> - 1 downto 0)
      b: IN std_logic_vector (<c_b_width> - 1 downto 0)
        ⋮
    );
  end component;

begin
    ⋮
end architecture behavior;
```

FIG. 1

TRANSLATION OF AN ELECTRONIC INTEGRATED CIRCUIT DESIGN INTO HARDWARE DESCRIPTION LANGUAGE USING CIRCUIT DESCRIPTION TEMPLATE

FIELD OF THE INVENTION

One or more aspects of the invention relate generally to electronic integrated circuit design and, more particularly, to translating an electronic design of an integrated circuit (IC) into hardware description language (HDL).

BACKGROUND OF THE INVENTION

Hardware Description Languages (HDLs), such as the Very high-speed integrated circuit Hardware Description Language (VHDL) or Verilog, are text-based approaches to digital logic design. They allow both behavioral and structural descriptions of design elements. HDL can be used to design: (1) a programmable logic device (PLD), such as a field programmable gate array (FPGA) or complex programmable logic device (CPLD); (2) a mask programmable device, such as a hardwired pin grid array (PGA), application-specific standard product (ASSP) or application specific integrated circuit (ASIC); (3) a system formed from selected electronic hardware components; or (4) any other electronic device. The HDL-based approach to design requires the user to describe the behavior of a system, which can then be simulated to determine whether the design will function as desired. The design is then synthesized to create a logical network list ("netlist") that can be implemented within a particular device.

Many tools exist that allow electronic designs of integrated circuits (ICs) to be assembled, simulated, debugged, and translated into hardware. Some such tools, known as high-level modeling systems (HLMSs), allow IC designs to be described and simulated in a high level and abstract environment, then translated automatically into working electronic hardware. Often an HLMS writes HDL files to describe the hardware it produces.

One approach to producing HDL files from an HLMS is to employ text files known as "HDL templates". An HDL template consists largely of ordinary fixed HDL constructs, but also contains variable portions that are "tailored" by the HLMS to match the particulars of the design. Typically the variable portions describe names and numbers of ports, values of parameters, and details of subsidiary blocks. Once a template has been tailored, it becomes a functioning HDL description of a portion of an electronic IC design that may be simulated or synthesized.

FIG. 1 depicts an exemplary VHDL template 100 that may be used to implement multipliers. Template 100 includes a fixed portion 101 and a variable portion 102. The variable portion 102 includes placeholders 105 that are indicated using particular delimiters, such as angled brackets 103 or an HDL comment 104. Notably, the variable portion 102 includes <entity name>, <component name>, <c_a_width>, and <c_b_width> placeholders 105, as well as the "--Port needed only when registered" comment 105. A specific multiplier may be realized in HDL by tailoring template 100. The placeholders 105 within the variable portion 102 are substituted with values, or deleted, as necessary.

One way that an HLMS can tailor templates is by using custom text processing software. This approach, however, has several drawbacks. An HLMS usually provides a broad and varied collection of design building blocks, and the collection usually grows as the HLMS is augmented and developed. Each building block typically has several associated HDL templates, and the kinds of tailoring that are needed may vary considerably. An HLMS may make it possible for a user or a third party to augment the collection with custom building blocks, in which case it is impossible to anticipate all the varieties of tailoring that might be needed. For these reasons it is difficult to write custom text processing software for an HLMS. At the same time, powerful free software tools, such as Perl, Python, sed, and awk, are well suited to handling text processing problems in general. Occasionally, tailoring a template requires the full power of such general-purpose tools, but more often the problems are simple, and a simpler approach is desirable.

Therefore, there exists a need to avoid or reduce the number of custom text processors employed to tailor HDL templates in an HLMS, instead using general-purpose text processing tools.

SUMMARY OF THE INVENTION

Method, apparatus, and computer readable medium for translating an electronic design of an integrated circuit into circuit description language is described. The electronic design includes a plurality of circuit descriptions representing behavior of circuit elements. A circuit description template is associated with a circuit description of the plurality of circuit descriptions. The circuit description template includes a first portion for fixed attributes of the circuit description and a second portion for variable attributes of the circuit description. One or more text processors are associated with the circuit description template. Variable attributes of the circuit description are related to the second portion of the circuit description template to produce a data structure. The circuit description template is processed using the one or more text processors with the data structure as parametric input.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 1 depicts an exemplary VHDL template that may be used to implement multipliers;

DETAILED DESCRIPTION OF THE DRAWINGS

Method and apparatus for translating an electronic IC design into HDL is described. One or more aspects of the invention are described with respect to translating an electronic IC design implemented within an HLMS into HDL. Those skilled in the art, however, will appreciate that the invention may be used with any electronic design tool that translates electronic IC designs into HDL. One example is a schematic editor that writes a design as HDL; a second is a text-based design tool that allows a user to assemble a design from a library of fixed HDL blocks as well as HDL templates.

Figure 2:
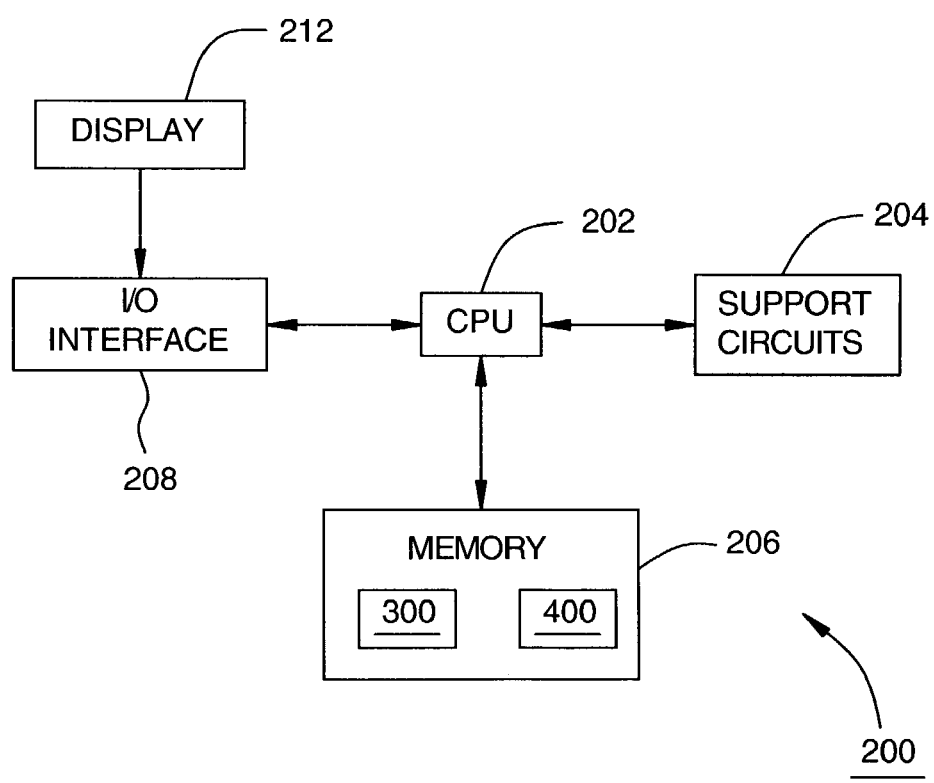
FIG. 2 depicts a block diagram showing an exemplary embodiment of a computer system suitable for implementing processes and methods in accordance with one or more aspects of the invention.

FIG. 2 depicts a block diagram showing an exemplary embodiment of a computer system 200 suitable for implementing processes and methods in accordance with one or more aspects of the invention. Computer system 200 includes a central processing unit (CPU) 202, a memory 206, a variety of support circuits 204, and an I/O interface 208. CPU 202 may be any type of microprocessor known in the art. Support circuits 204 for CPU 202 include conventional cache, power supplies, clock circuits, data registers, I/O interfaces, and the like. I/O interface 208 may be directly coupled to memory 206 or coupled through CPU 202, and may be coupled to a conventional keyboard, network, mouse, printer, and interface circuitry adapted to receive and transmit data, such as data files and the like. I/O interface 208 may be coupled to a display 212.

Memory 206 may store all or portions of one or more programs and/or data to implement the processes and methods of the invention. Although the invention is disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 200 may be programmed with an operating system, which may be OS/2, Java Virtual Machine, Linux, Solaris, Unix, Windows, Windows95, Windows98, Windows NT, and Windows2100, WindowsME, and WindowsXP, among other known platforms. At least a portion of an operating system may be disposed in memory 206. Memory 206 may include one or more of the following random access memory, read only memory, magneto-resistive read/write memory, optical read/write memory, cache memory, magnetic read/write memory, and the like, as well as signal-bearing media as described below. Memory 206 may store all or a portion of high-level modeling system 300 of FIG. 3. Memory 206 may store all or a portion of template tailoring process 400 of FIGS. 4A and 4B.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
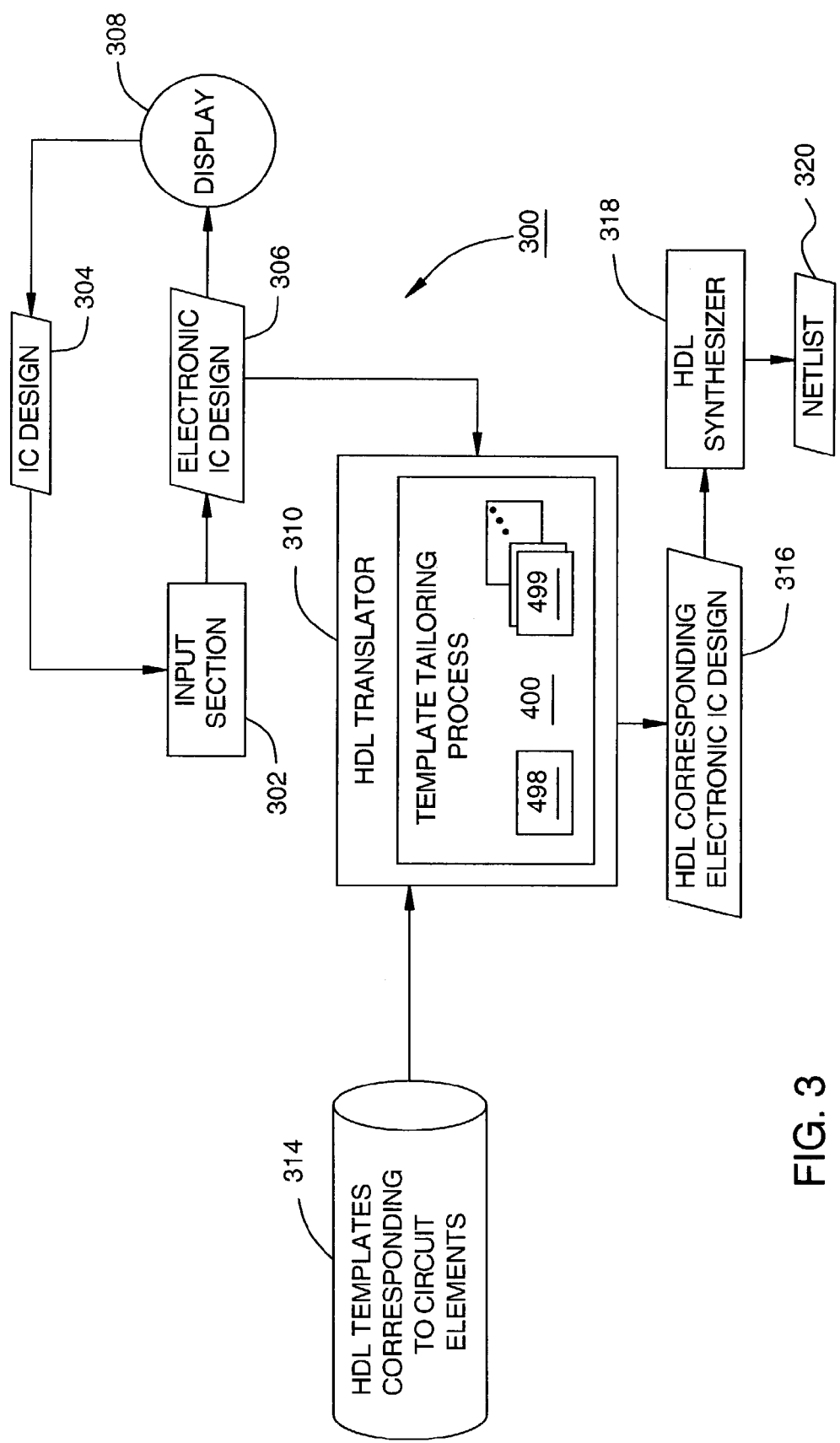
FIG. 3 depicts a high-level block diagram showing an exemplary embodiment of a modeling system in accordance with one or more aspects of the invention.

FIG. 3 depicts a high-level block diagram showing an exemplary embodiment of a modeling system 300 in accordance with one or more aspects of the invention. Modeling system 300 includes an input section 302, a display 308, an HDL translator 310, and an HDL synthesizer 318. In an embodiment, modeling system 300 is implemented using computer system 200 of FIG. 2. Notably, input section 302, HDL translator 310, and HDL synthesizer 318 may be all or portions of one or more programs stored within memory 206 and executed by CPU 202. An IC design 304 is input, such as at a schematic or logic level, to modeling system 300 using input section 302 and display 308. Input section 302 produces data 306 that includes an electronic representation of IC design 304 ("electronic IC design data 306"). Electronic IC design data 306 may be schematically represented on display 308.

In an embodiment, electronic IC design data 306 is an abstraction of IC design 304 that includes "blocks", "ports", and "nets". Blocks, or logic blocks, represent sections, having circuit elements, of IC design 304. Ports represent inputs and outputs of blocks, and nets, or networks, represent connections between various ports of various blocks. Each block includes fixed attributes and variable attributes. For example, a multiplier might include a fixed attribute describing the algorithm to be used to multiply, and variable attributes relating to the number of input ports (i.e., the number of signals to be multiplied together) and the latency (i.e., the number of clock cycles that elapse between the time when signals are presented to the multiplier and the time when the product is available).

The blocks, ports, and nets of data 306 represent an abstraction of IC design 304 in a well-known manner. For example, blocks, ports, and nets are abstractions that may be produced by System Generator for DSP, commercially available from Xilinx, Inc, or other known abstraction translators. As understood by those skilled in the art, however, integrated circuit design systems may employ other types of abstractions to represent an IC design in addition to, or in place of, the above-described blocks, ports, and nets. In general, electronic IC design data 306 includes a plurality of circuit descriptions that represent the behavior of circuit elements of IC design 304.

HDL translator 310 receives data 306 and HDL templates 314. HDL templates 314 are text files that include fixed portions and variable portions, as described above. HDL templates 314 correspond to various blocks within electronic IC design data 306. The fixed portions of HDL templates 314 include HDL constructs that provide behavioral or structural descriptions of the fixed attributes of blocks within the electronic IC design. In an embodiment, the variable portions of HDL templates 314 include various placeholders (generally referred to as variable attribute identifiers) that are to be modified using the variable attributes of blocks within the electronic IC design. For example, the placeholders are demarcated within HDL templates 314 using particular delimiters, such as angled brackets, double dashes, or the like. In general, any delimiters may be employed.

In another embodiment, the variable portions of HDL templates 314 are not demarcated using variable attribute identifiers and do not include delimiters. Rather, the variable portions of HDL templates 314 may include HDL constructs that provide behavioral or structural descriptions of the variable attributes of blocks within the electronic IC design. The variable HDL constructs are modified using the variable attributes of blocks within the electronic IC design.

HDL translator 310 executes template tailoring process 400 to tailor HDL templates 314 using data 306. Template tailoring process 400 is described in more detail below. HDL translator 310 produces data 316 responsive to data 306, namely, an HDL representation of the electronic IC design. HDL synthesizer 318 receives data 316 and synthesizes the HDL code to create a netlist 320 that can be implemented within hardware with placement and routing. The HDL synthesis process is well-known in the art.

Figure 4A:
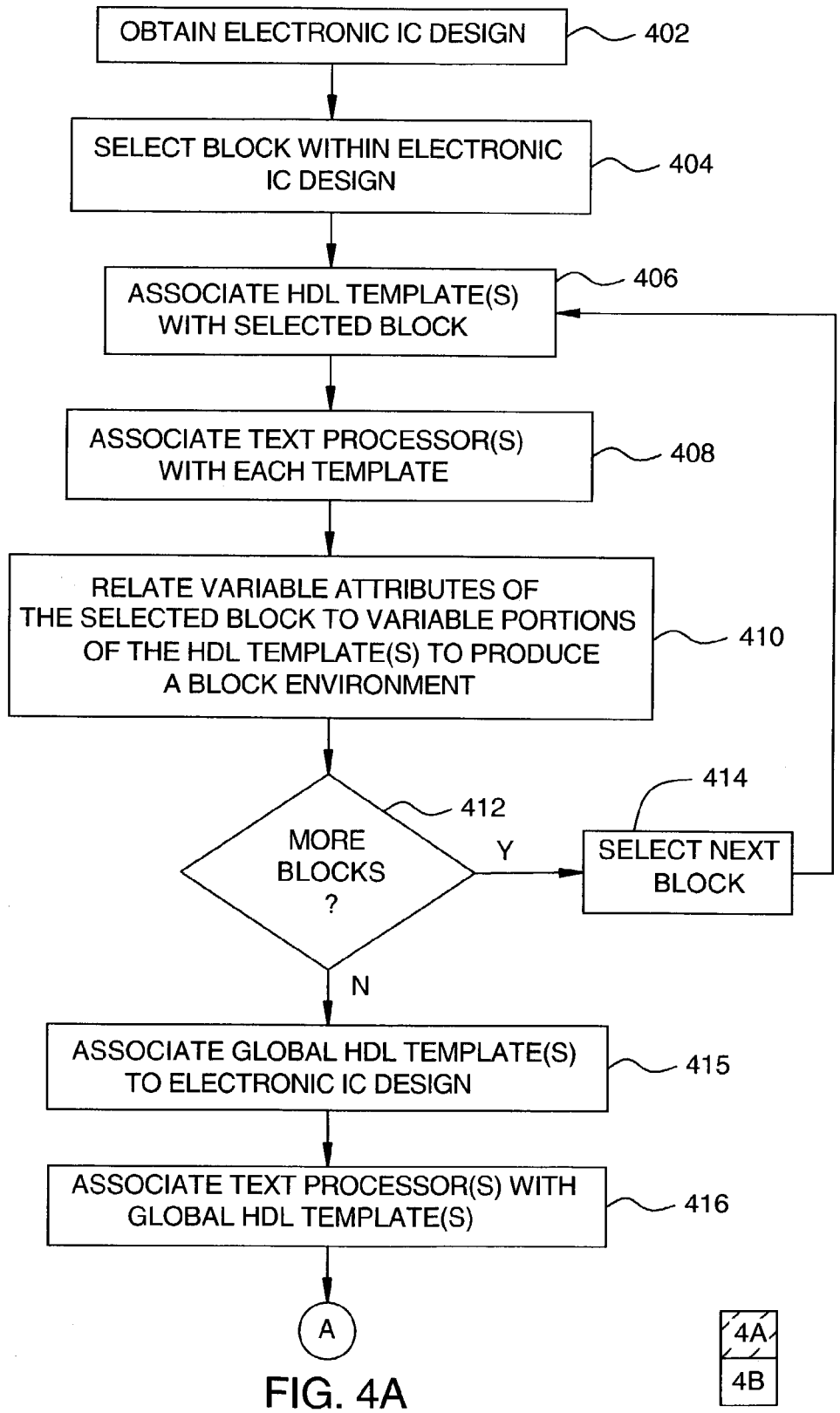
FIGS. 4A and 4B depict a flow diagram showing an exemplary embodiment of a template tailoring process in accordance with one or more aspects of the invention.
Figure 4B:
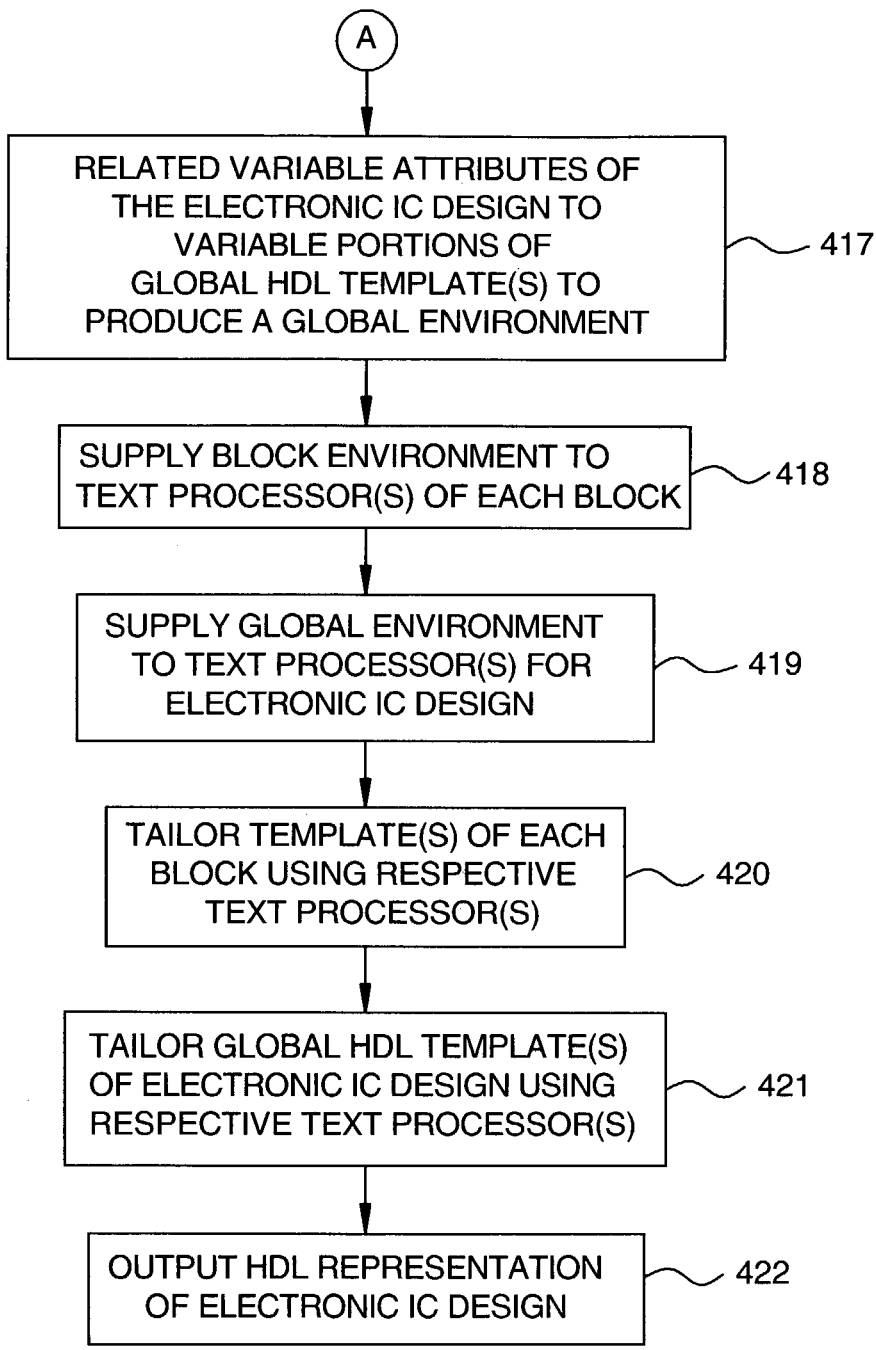

FIGS. 4A and 4B depict a flow diagram showing an exemplary embodiment of template tailoring process 400 in accordance with one or more aspects of the invention. Process 400 may be understood with simultaneous reference to FIGS. 2 and 3. In an embodiment, process 400 is implemented using computer system 200 of FIG. 2. Notably, all or portions of one or more programs of process 400 may be stored within memory 206 and executed by CPU 202.

Process 400 begins at step 402, where an electronic IC design is obtained. As described above, an electronic IC design is produced by modeling system 300. At step 404, a block within the electronic IC design is selected. At step 406, an HDL template is associated with the selected block. In an embodiment, the selected block specifies a source location within memory 206 for the HDL template, a name of the HDL template, and a destination location within memory 206 for storing tailored HDL template. Notably, more than one HDL template may be specified by a block, so more than one source, name, and destination may be specified by a block.

At step 408, one or more text processors are associated with an HDL template of step 406. The text processors may be applied to an HDL template sequentially, with each text processor operating on the results produced by its predecessor. In an embodiment, each text processor is program code written using an interpreted language, such as Perl, or a compiled language such as C or C++, or like type interpreted or compiled languages known in the art. For example, a text processor may be a special-purpose Perl script that is particular to the block and to the HDL template being tailored. In another example, the text processor is a general-purpose script that incorporates no specifics of the block, the HDL template, or the IC design. In either example, the invention obviates the need to write custom text processing machinery to process an HDL template.

At step 410, variable attributes of the selected block are related to variable portions of the HDL template to produce a data structure ("block environment" 499). The text processors associated with each HDL template are passed this data structure as a parameter, and thus run in an environment defined by the block. In an embodiment, the block environment is a hash table having keys and associated values. In general, the keys are strings that are suited to template tailoring and the values are any data that is supported by the text processor suitable for tailoring the HDL template. For example, the keys may be strings corresponding to variable attribute identifiers in the HDL template. The values may be strings associated with the variable attributes of the selected block.

As described above, variable attribute identifiers may be demarcated within the HDL template using predetermined delimiters. Such variable attribute identifiers, in general, may be anything that can be manipulated by a text processor. Often variable attribute identifiers are variables that are to be replaced or conditionally deleted as heretofore described. Alternatively, as described more fully below, variable attribute identifiers may be directives or embedded code to be executed by a text processor. The variable attributes of the selected block include attributes such as the names and numbers of input and output ports, latency, and the like. Notably, if a block omits information, such as one or more templates or text processors to be used, defaults, templates or text processors, may be substituted.

At step 412, a determination is made as to whether there are any more blocks within the electronic IC design to be processed. If there are more blocks, process 400 proceeds to step 414, where the next block is selected and steps 406 through 410 are repeated. Thus, there may be multiple data structures 499 for respective selected blocks 404. If there are no more blocks, process 400 proceeds to step 415.

At step 415, one or more "global" HDL templates are associated with the electronic IC design. Global HDL templates are HDL templates that are associated with the IC design as a whole, but not to any particular block within the IC design. An example might be a template for a library that is shared by several portions of the IC design. As with blocks, the electronic IC design has variable attributes that are global to the IC design. Examples of global attributes may include the names of global clock signals, speed estimates for the design, total latency, as well as other characteristics of the IC design as a whole. At step 416, one or more text processors are associated with the global HDL templates in a similar manner as the text processors of step 408.

At step 417, variable attributes of the electronic IC design are related to variable portions in the global HDL templates to produce a design-level data structure ("global environment" 498). Global environment 498 may be used to convey information that cannot be, or is not resident to, any particular block. For example, an electronic IC design may include many multiplexers, each having a unique name within the design, where a block may have resident information of names of its multiplexers, but not names of multiplexers of other blocks. In an embodiment, global environment 498 is a hash table in which keys are strings corresponding to variable attribute identifiers in design-level or global HDL templates, and values are data associated with design-level or global variable attributes of the electronic IC design.

At step 418, each block's environment 499 is supplied to the text processors respectively associated with the HDL templates for the block. Similarly, at step 419, global environment 498 is supplied to the text processors respectively associated with the global HDL templates. At step 420, the HDL templates of each block are tailored using the associated text processors with each block's environment 499 as parametric input. Similarly, at step 421, the global HDL templates are tailored using the associated text processors with global environment 498 as parametric input. At step 422, an HDL representation of the electronic IC design is produced as derived from IC design data 304 as described. Accordingly, process 400 may be for a single template and a single text processor for each block of the electronic IC design, or for multiple templates and multiple text processors associated with one or more blocks.

Process 400 may be understood with reference to the following examples. In a first example, a multiplier block is selected. As described above, FIG. 1 depicts an exemplary VHDL template 100 for a multiplier block. Template 100 is associated with the multiplier block. A Perl script is associated with template 100. A block environment is produced including a hash table, where the keys correspond to placeholders 105 of template 100 and the values correspond to the variable attributes of the multiplier block. Notably, placeholders 105 of template 100 are <entity name>, <component name>, <c_a_width>, and <c_b_width>, as well as the "--Port needed only when registered" HDL comment. The variable attributes of the multiplier block are the name to be used for the VHDL entity that implements the block, the width of port 'a', the width of port 'b', and whether the block is "registered" (i.e., whether the latency is nonzero).

The Perl script includes a general-purpose text processor that receives a block environment as a parameter. The Perl script tailors template 100 by substituting values for keys, conditionally inserting lines, and conditionally deleting lines. The Perl script in the example is generic in that no specific information from the electronic IC design is required to write the script. Rather, the variable attributes of the multiplier block and the electronic IC design are passed as parameters to the script as the block environment. This eliminates the need to write a custom text processor to tailor template 100. In this example, using a general-purpose script is appropriate because the kinds of processing that are needed are simple and straightforward. When this is not the case, a problem-specific script can, with minimal effort, be substituted.

In another embodiment, the general-purpose Perl script described above may be equipped to deal with "preprocessor directives" embedded directly in the template itself. For example, consider the following portion of a VHDL template for a multiplexer block:

```
port (
--! for ("i", 0, <mux_width>, 1)
   din<i>: in std_logic_vector
      din <i>_width-1 downto 0);
   din<i>_valid : in std_logic;
--! end
s : in std_logic_vector (s_width-1 downto 0);
s_valid : in std_logic;
en : in std_logic_vector (en_width-1 downto 0);
rst : in std_logic_vector (rst_width-1 downto 0);
ce : in std_logic;
clr : in std_logic;
clk : in std_logic;
dout : out std_logic_vector (dout_width-1 downto 0);
dout_valid : out std_logic);
```

In this example, the directive is a for-loop delimited by the two "--!" symbols. This loop is intended to be executed by the Perl script. The results of executing the loop are to be used to replace the loop in the template. The directive includes placeholders, notably, <mux_width> and <i>. The value of <mux_width> is supplied by the block environment, while that for <i> is supplied by execution of the loop. Thus, the Perl script remains generic in that no specific information about the multiplexer is required to write the script. Rather, the Perl script executes the directive using variable attributes obtained from the block environment.

In yet another embodiment, the general-purpose Perl script may include the ability to execute Perl code embedded directly within an HDL template. For example, consider the following portion of a VHDL template for a multiplexer block:

```
--! set ("corePortNames", "['MA', 'MB', 'MC', 'MD',
   'ME', 'MF'. 'MG', 'MH', 'MAA', 'MAB', 'MAC',
   'MAD', 'MAE', 'MAF', 'MAG', 'MAH', 'MBA',
   'MBB', 'MBC', 'MBD', 'MBE', 'MBF', 'MBG',
   'MBH', 'MCA', 'MCB', 'MCC', 'MCD', 'MCE',
   'MCF', 'MCG', 'MCH', ]")
--! perl
my(@text);
my(@corePortNames)=<corePortNames>;
for (my($i)=0; $i <<mux_width>; $i++) {
push(@text, " ". $corePortNames->[$i]. "=>
conv_din$I". ",");
}
\@text;
--! end
```

In this example, the code is delimited by the two "--!" symbols. The code includes placeholders, notably, <mux_width>, and <corePortNames>. The values for these are obtained from the block environment. The Perl script replaces the embedded code with the results of executing the code. The Perl script remains generic in that no specific information about the multiplexer is required to write the script. Rather, the Perl script executes the embedded code using variable attributes obtained from the block environment described above. Tailoring this template results in the following VHDL for a multiplexer:

```
port map (
   MA => conv_din0,
   MB => conv_din1,
   MC => conv_din2,
   MD => conv_din3,
   ME => conv_din4,
   MF => conv_din5,
   MG => conv_din6,
   MH => conv_din7,
   o => core_dout;
   s => s);
```

An exemplary general-purpose Perl script is shown in the appendix which is herein incorporated by reference.

Method and apparatus for translating an electronic design of an integrated circuit into hardware description language has been described. The invention associates HDL templates, text processors, and environments with blocks of an electronic IC design, and with the design as a whole. The text processors may employ general-purpose text processing tools such as Perl, Python, awk, and sed, obviating the need to write custom text processing machinery. Scripts for text processing can be generic when only simple and straightforward processing is needed, but problem-specific scripts can be substituted when processing is idiosyncratic.

Generic scripts may support simple preprocessing directives and direct embedding of code within templates, minimizing the need for problem-specific scripts. A list (possibly empty) of scripts is associated to each template. Scripts are executed in sequence, with each script operating on the results produced by its predecessor. Each script executes in a block specific or design specific environment that is passed to the script as a parameter. In this manner, an electronic IC design may be translated into HDL by tailoring HDL templates. Tailoring can be accomplished without writing custom text processing software, and can take advantage of the full power and flexibility of modern general-purpose text processing tools.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

APPENDIX

MAPVHDL

```perl
#! /usr/local/bin/perl -w
package mapvhdl;
# Hash table that translates each command name to the name of the corresponding
# perl subroutine.
$internalCmdNames = {
    "if" => "ifCmd",
    "else" => "elseCmd",
    "perl" => "perlCmd",
    "for" => "forCmd",
    "set" => "setCmd",
};
# Hash table that tells which are the single line commands.
$oneLineCmds = {
    "set" => 1,
};
# Global variable that tells the most recent result of evaluating the Boolean
# condition for an "if" command.
$conditionReg = 0;

# Substitutes values for patterns in a line, then returns the result.
# The patterns (values) are given by the keys (values) in a hash table.

# @param $line Line to be updated.
# @param %$symTab Tells patterns and values to use when replacing.

# @return Result of substituting keys/values from %$symTab into $line.

sub substituteKeyValues {
    my($line, $symTab) = @_;
    return $line unless ($line =~ /<\w+>/);
    # Replace keys with values in $line.
    foreach $key (keys %$symTab) {
        my($value) = $symTab->{$key};
        $line =~ s/$key/$value/g;
    }
    # Replace each remaining < . . . > in $line with undef.
    $line =~ s/<\w+>/undef/g;
    return $line;
}

# Returns the result of executing an "if" command on an array of text. This
# is the text from the array if a given boolean condition is true; otherwise
# it is an empty array. This command is more or less the equivalent of the
# cpp #ifdef. Note: A side effect of executing an if command is that the
# old value of the condition register is saved, and then the register is
# assigned the value of the Boolean condition. When the if command is
# complete, the previous value of the condition register is restored.

# @param $args Boolean condition to test.
# @param @$text Array of text to process.
# @param %$symTab Hash table table that tells how to translate < . . . > patterns
into values.

# @return Text in @$text if the Boolean condition is true; otherwise an empty
#         array.

sub ifCmd {
    my($args, $text, $symTab) = @_;
    # Evaluate $args to get Boolean condition.
    my(@evaledArgs) = eval(&substituteKeyValues($args, $symTab));
    &internal($@) if ($@);
    scalar(@evaledArgs) == 1 ||
        &internal("trouble evaluating '$args' in if command");
    # Save the old value of the condition register, then assign the Boolean
    # condition as the new value.
    my($oldConditionReg) = $conditionReg;
    $conditionReg = $evaledArgs[0];
    # If the Boolean condition was defined and true, return the text; otherwise
    # return an empty array.
    my($results) = defined($conditionReg) && $conditionReg ?
                        &processText($text, $symTab): [ ];
    $conditionReg = $oldConditionReg;
    return $results;
}

# Returns the result of executing an "else" command on an array of text. This
# is the array with no changes if the condition register is undefined or zero;
```

APPENDIX-continued

MAPVHDL

```
# otherwise it is an empty array.

# @param $args Meaningless parameter that should be undefined.
# @param @$text Array of text to process.
# @param %$symTab Hash table table that tells how to translate < . . . > patterns
into values.

# @return Text in @$text if the condition register is undefined or zero;
#                 otherwise an empty array.

sub elseCmd {
    my($args, $text, $symTab, $cnd) = @_;
    ! defined($args) || &internal("else command takes no arguments");
    return defined($conditionReg) && $conditionReg? [ ]:
        &processText($text, $symTab);
}

# Evaluates an assignment to a preprocessor variable. This sets a value
# in the symbol table but otherwise does nothing.

# @param @args Array containing two elements:
#                 $args[0] Tells the preprocessor variable to assign to.
#                 $args[1] Perl text, that, when eval'ed, tells the value to assign.
# @param @$text Meaningless array that is part of the argument list for
#                 consistency.
# @param %$symTab Hash table table that tells how to translate < . . . > patterns
into values.

# @return Empty array (returned for consistency).

sub setCmd {
    my($args, $text, $symTab) = @_;
    # Evaluate $args to get name of preprocessor variable that should be
    # assigned to, and value that should be assigned.
    my(@evaledArgs) = eval(&substituteKeyValues($args, $symTab));
    &internal($@) if ($@);
    scalar(@evaledArgs) == 2 ||
        &internal("trouble evaluating '$args' in set command");
    my($pattern) = $evaledArgs[0];
    $pattern = "<$pattern>" unless ($pattern =~ /^<.*>$/);
    $symTab->{$pattern} = $evaledArgs[1];
    return [ ];
}

# Returns the result of executing a "for" command on an array of text. The
# is the array of text repeated several times, with substitutions performed.

# @param @args Array of four manditory arguments and one optional argument.
#                 $args[0] - Pattern to replace.
#                 $args[1] - Starting index when replacing.
#                 $args[2] - Ending index plus one.
#                 $args[3] - Increment
#                 $args[4] - Optional array of substitutions.
# @param @$text Text to operate on.
# @param %$symTab Hash table table that tells how to translate < . . . > patterns
into values.

# @return Result of repeating text in @$text several times with substitutions.

sub forCmd {
    my($args, $text, $symTab) = @_;
    # Evaluate $args, then extract the pieces.
    my(@evaledArgs) = eval(&substituteKeyValues($args, $symTab));
    &internal($@) if ($@);
    scalar(@evaledArgs) == 4 || scalar(@evaledArgs) == 5 ||
        &internal("trouble evaluating '$args' in for command");
    my($pattern, $start, $end, $incr, $replacements) = @evaledArgs;
    $pattern ="<$pattern>" unless ($pattern =~ /^<.*>$/);
    # Execute a real perl for loop, substituting something appropriate for
    # $pattern at each step.
    my(@newText);
    for (my($i) = $start; $incr > 0? $i < $end : $i > $end; $i += $incr) {
        my($rep) = defined($replacements)? $replacements->[$i] : $i;
        $symTab->{$pattern} = $rep;
        my(@temp);
        push(@temp, @$text);
        my($results) = &processText(\@temp, $symTab);
```

APPENDIX-continued

MAPVHDL

```perl
            push(@newText, @$results);
        }
        return \@newText;
}

# Returns the result of executing a "perl" command on an array of text. This
# is whatever is returned by the perl text when it is eval'ed.

# @param $args Meaningless argument that should equal undef.
# @param @$text Array of perl text to execute with an eval.
# @param %$symTab Hash table table that tells how to translate < . . . > patterns
into values.

# @return Result returned with text in @$text is eval'ed.

sub perlCmd {
    my($args, $text, $symTab) = @_;
    # Verify $args is undef.
    ! defined($args) || &internal("perl command takes no arguments");
    # Evaluate perl code and return the results.
    my($text1) = &processText($text, $symTab);
    my($tmp) = join(" ", @$text1);
    $tmp =~ s/\r//g;
    $results = eval($tmp);
    exit(1) unless (defined($@) && ref($results) eq "ARRAY");
    return $results;
}

# Returns the array of text that results when a given command is run on a given
# array of text.

# @param $cmd Name of the command to run.
# @param $args Arguments to the command.
# @param @$text Array of text to process with the command.
# @param %$symTab Hash table table that tells how to translate < . . . > patterns
into values.

# @return Array of text produced when command is run.

sub runCmd {
    my($cmdName, $args, $text, $symTab) = @_;
    # Verify $cmdName is really the name of a command.
    my($internalCmdName) = $internalCmdNames-> {$cmdName};
    defined($internalCmdName) ||
        &internal("there is no preprocessing command named $cmdName");
    return &$internalCmdName($args, $text, $symTab);
}

# Returns the name of a preprocessing command and the arguments that should
# be passed to the command.

# @param $s String from which the command name and arguments should be
#                  extracted.

# @return $cmdName Name of the command to run.
# @return $args Arguments that should be passed to the command.

sub extractCmdNameAndArgs {
    my($s) = @_;
    $s =~ s/^\s*//;
    return ($1, undef) if ($s =~ /^(\S+)\s*$/);
    return ($1, $2) if ($s =~ /^(\S+)\s+(.*)$/);
    internal("$s is not a well-formed preprocessing command");
}
# Returns the raw text on which a command should operate. This function
# assumes we have just seen the line that begins the command, and the text on
# which the command should operate is delimited by a corresponding end.
# The text that is returned is not processed in any way.

# @param @$text Array from which raw text should be extracted.

# @return Raw text on which a command should operate.

sub extractRawText {
    my($text) = @_;
    my(@rawText);
    my($line) = shift(@$text);
```

APPENDIX-continued

MAPVHDL

```perl
        my($cnt) = 0;
        while(defined($line)) {
            if($line =~ /\s*--!\s*end\s*$/i) {
                # saw an --! end
                return \@rawText if ($cnt == 0);
                $cnt--;
                push(@rawText, $line);
            }
            elsif($line =~ /^\s*--!(.*)$/) {
                # saw an --! cmd arg arg . . .
                $cnt++;
                push(@rawText, $line);
            }
            else {
                push(@rawText, $line);
            }
            $line = shift(@$text);
        }
        return \@rawText;
}

# Processes the text in a given array, then returns the results.

# @$text Array containing text to process.
# @param %$symTab Hash table table that tells how to translate < . . . > patterns
into values.

# @return Array containing results of text processing.

sub processText {
    my($text, $symTab) = @_;
    my(@newText);
    my($line) = shift(@$text);
    while (defined($line)) {
        if($line =~ /\s*--!\s*end\s*$/i) {
            # saw an --! end
            return \@ newText;
        }
        elsif($line =~ /^\s*--!(.*)$/) {
            # saw an --! cmd arg arg . . .
            my($cmdName, $args) = &extractCmdNameAndArgs($1);
            my($results) = defined($oneLineCmds-> {$cmdName})?
                &runCmd($cmdName, $args, [ ], $symTab) :
                &runCmd($cmdName, $args, &extractRawText($text), $symTab);
            push(@newText, @$results);
        }
        elsif ($line =~ /^(.*)--!(.*)$/) {
            # saw a trailing --! cmd arg arg . . . on a nonempty line
            my($temp) = [$1];
            my($cmdName, $args) = &extractCmdNameAndArgs($2);
            my($results) = &runCmd($cmdName, $args, $temp, $symTab);
            push(@newText, @$results);
        }
        else {
            push(@newText, &substituteKeyValues($line, $symTab));
        }
        $line = shift(@$text);
    }
    return \@newText;
}

# Updates the text of a Sysgen VHDL template so it has real core names,
# a real entity name, and values substituted for generics.

# @param @$text Text to be updated.
# @param %$netlisterEnv Hash table of key/values constructed by the netlister.
#                 Tells entity name, core names, generic key/values, etc.
# @param %$environment Hash table constructed by the block. Tells misc
#                 key/values to be used to update text.

# @return Array of updated text.

sub updateText {
    my($text, $netlisterEnv, $enviromnent) = @_;
    chomp(@$text);
    # Extract fields from the environment hash table.
    $netlisterEnv = { } unless (defined($netlisterEnv));
```

APPENDIX-continued

MAPVHDL

```
    $environment = { } unless (defined($environment));
    # Make fake key/value pairs in environment hash table for entries
    # from lines_to_delete array. This code is a hack that will not be needed
    # once S-function handling of lines to delete is current.
    my($deletingPatterns) = $environment-> {"lines_to_delete"};
    $deletingPatterns = [ ] unless (defined($deletingPatterns));
    foreach $pattern (@$deletingPatterns) {
        my($p) = $pattern;
        $enviromnent-> {$p} = 1;
    }
    # Make single symbol table that contains the key/values from %$environment
    # and %$netlisterEnv. In the symbol table, each key is bracketed with
    # "< . . . >".
    my($symTab) = { };
    foreach $key (keys %$netlisterEnv) {
        my($k) = $key =~ /^<.*>$/? $key : "<$key>";
        $symTab->{$k} = $netlisterEnv-> {$key};
    }
    foreach $key (keys %$environment) {
        my($k) $key =~ /^<.*>$/? $key : "<$key>";
        $symTab-> {$k} = $environment-> {$key};
    }
    # Run the text processor to delete lines, run embedded perl, etc.
    return &processText($text, $symTab);
}
\&updateText;
```

What is claimed is:

1. A method of translating an electronic design of an integrated circuit into circuit description language, the electronic design having a plurality of circuit descriptions representing behavior of circuit elements, the method comprising:

associating a circuit description template with a circuit description of the plurality of circuit descriptions, the circuit description template having a first portion for a first type of attributes of the circuit description and a second portion for a second type of attributes of the circuit description;

associating one or more general-purpose text processors with the circuit description template;

relating variable attributes of the circuit description to the second portion of the circuit description template to produce a data structure; and processing the circuit description template using the one or more general-purpose text processors with the data structure as parametric input.

2. The method of claim 1, wherein relating comprises:

providing a plurality of variable attribute identifiers within the second portion; and associating the variable attributes of the circuit description with the plurality of variable attribute identifiers.

3. The method of claim 1, wherein the step of processing comprises at least one of:

executing one or more directives embedded within the circuit description template using one or more of the general-purpose text processors with the data structure as first parametric input; and executing program code embedded within the circuit description template using one or more of the general-purpose text processors with the data structure as second parametric input.

4. The method of claim 1, wherein the one or more general-purpose text processors include at least one of a Perl script, a Python script, sed, and awk.

5. A method of translating an electronic design of an integrated circuit into circuit description language, the electronic design having circuit descriptions representing behavior of circuit elements, the method comprising:

respectively associating circuit description templates with the circuit descriptions, the circuit descriptions having attributes, the circuit description templates each having a first portion for a fixed type of the attributes and a second portion for a variable type of the attributes;

associating at least one general-purpose text processor with each of the circuit description templates;

relating variable attributes of the circuit descriptions to the second portion of each of the circuit description templates to produce respective data structures; and processing each of the circuit description templates with the at least one general-purpose text processor associated therewith using a related data structure of the data structures as parametric input.

6. A method of translating an electronic design of an integrated circuit into hardware description language, the electronic design having a plurality of circuit descriptions representing behavior of circuit elements, the method comprising:

associating a hardware description language template with a block circuit description, the hardware description language template having a fixed portion related to fixed attributes of the block circuit description and a variable portion related to variable attributes of the block circuit description;

associating one or more general-purpose text processors with the hardware description language template;

relating variable attributes of the block circuit description to the variable portion of the hardware description language template to produce block environment data; and tailoring the hardware description language template to the block circuit description using the one or more general-purpose text processors with the block environment data as parametric input.

7. The method of claim 6, wherein relating comprises:
providing a plurality of placeholders within the variable portion; and
associating the variable attributes of the block circuit description with the plurality of placeholders.

8. The method of claim 7, wherein the relating further comprises forming a hash table having a plurality of keys and a plurality of values respectively associated with the keys, the plurality of keys corresponding to the plurality of placeholders, the plurality of values corresponding to the variable attributes of the block circuit description.

9. The method of claim 6, wherein the tailoring comprises at least one of:
executing one or more pre-processing directives embedded within the hardware description language template using the one or more general-purpose text processors with the block environment data as the parametric input; and
executing program code embedded within the hardware description language template using the one or more general-purpose text processors with the block environment data as the parametric input.

10. The method of claim 6, further comprising:
associating one or more additional hardware description language templates with the block circuit description, each of the one or more additional hardware description language templates having a respective fixed portion for fixed attributes of the block circuit description and a respective variable portion for variable attributes of the block circuit description; and
repeating the associating the one or more general-purpose text processors, the relating, and the adjusting for each of the one or more additional hardware description language templates.

11. The method of claim 6, further comprising:
associating a global hardware description language template with the electronic design, the global hardware description language template having a fixed portion for fixed attributes of the electronic design and a variable portion for variable attributes of the electronic design;
associating another one or more general-purpose text processors with the global hardware description language template;
relating variable attributes of the electronic design to the variable portion of the global hardware description language template to produce global environment data; and
adjusting the global hardware description language template using the other one or more general-purpose text processors with the global environment data as parametric input.

12. A computer readable medium having stored thereon instructions that, when executed by a processor, cause the processor to perform a method of translating an electronic design of an integrated circuit into circuit description language, the electronic design having a plurality of circuit descriptions representing behavior of circuit elements, the method comprising:
associating a circuit description template with a circuit description of the plurality of circuit descriptions, the circuit description template having a first portion for a first type of attributes of the circuit description and a second portion for a second type of attributes of the circuit description;
associating one or more general-purpose text processors with the circuit description template;
relating variable attributes of the circuit description to the second portion of the circuit description template to produce a data structure; and
processing the circuit description template using the one or more general-purpose text processors with the data structure as parametric input.

13. An apparatus for translating an electronic design of an integrated circuit into circuit description language, the electronic design having a plurality of circuit descriptions representing behavior of circuit elements, the method comprising:
means for associating a circuit description template with a circuit description of the plurality of circuit descriptions, the circuit description template having a first portion for a first type of attributes of the circuit description and a second portion for a second type of attributes of the circuit description;
means for associating one or more general-purpose text processors with the circuit description template;
means for relating variable attributes of the circuit description to the second portion of the circuit description template to produce a data structure; and
means for processing the circuit description template using the one or more general-purpose text processors with the data structure as parametric input.

14. A computer program product, comprising:
a computer usable medium having computer readable program code means embodied therein for causing a translation of an electronic design of an integrated circuit into circuit description language, the electronic design having a plurality of circuit descriptions representing behavior of circuit elements, the computer readable program code means in the computer program product including computer readable program code means for causing a computer to:
associating a circuit description template with a circuit description of the plurality of circuit descriptions, the circuit description template having a first portion for a first type of attributes of the circuit description and a second portion for a second type of attributes of the circuit description;
associating one or more general-purpose text processors with the circuit description template;
relating variable attributes of the circuit description to the second portion of the circuit description template to produce a data structure; and
processing the circuit description template using the one or more general-purpose text processors with the data structure as parametric input.

15. A system for translating an electronic design of an integrated circuit into circuit description language, the electronic design having a plurality of circuit descriptions representing behavior of circuit elements, the method comprising:
a processing unit having access to one or more storage devices;
at least a portion of the one or more storage devices having a plurality of circuit description templates, each of the plurality of circuit description templates having a first portion for fixed attributes of one or more of the circuit descriptions, and a second portion for variable attributes of one or more of the circuit descriptions;
at least another portion of the one or more storage devices having a program product configured to:

associate a circuit description template with a circuit description of the plurality of circuit descriptions, the circuit description template having a first portion for fixed attributes of the circuit description and a second portion for variable attributes of the circuit description;

associate one or more general-purpose text processors with the circuit description template;

relate variable attributes of the circuit description to the second portion of the circuit description template to produce a data structure; and process the circuit description template using the one or more general-purpose text processors with the data structure as parametric input.

16. The system of claim 15, wherein the program product is further configured to:

associate one or more additional circuit description templates with the circuit description; and repeat the associating the one or more general-purpose text processors, the relating, and the processing for each of the one or more additional circuit description templates.

17. The system of claim 15, wherein the portion of the one or more storage devices includes a second circuit description template having a first portion for fixed attributes of the electronic design and a second portion for variable attributes of the electronic design, and the program product is further configured to:

associate the second circuit description template with the electronic design;

associate another one or more general-purpose text processors with the second circuit description template;

relate variable attributes of the electronic design to the second portion of the second circuit description template to produce a second data structure; and process the second circuit description template using the other one or more general-purpose text processors with the second data structure as other parametric input.

18. A method of translating an electronic design of an integrated circuit into circuit description language, comprising:

providing a modeling system for modeling the electronic design using a plurality of circuit blocks representing circuit element behavior;

associating a template with a circuit block of the plurality of circuit blocks, the template having a first portion of hardware description language constructs representing fixed portions of the circuit block, and a second portion of hardware description language constructs representing variable portions of the circuit block;

associating one or more general-purpose text processors with the template;

relating variable attributes of circuit block to the second portion of hardware description language constructs to produce a circuit block environment; and processing the template using the one or more general-purpose text processors with the circuit block environment as parametric input.

19. The method of claim 18, wherein the one or more general-purpose text processors include at least one of a Perl script, a Python script, sed, and awk.

20. A method of translating an electronic design, having circuit elements, of an integrated circuit into a hardware description language, the electronic design having a plurality of circuit descriptions in the hardware description language representing behavior of the circuit elements, the method comprising:

associating a circuit description template with a circuit description of the plurality of circuit descriptions, the circuit description template having a first portion for a first type of attributes of the circuit description and a second portion for a second type of attributes of the circuit description;

associating a plurality of text processors with the circuit description template;

relating variable attributes of the circuit description to the second portion of the circuit description template to produce a data structure; and processing the circuit description template using a text processor of the plurality of text processors with the data structure as parametric input.

* * * * *